(12) United States Patent
Pillarisetty et al.

(10) Patent No.: US 11,107,891 B2
(45) Date of Patent: Aug. 31, 2021

(54) HEXAGONAL ARRAYS FOR QUANTUM DOT DEVICES

(71) Applicant: Intel Corporation, Santa Clara, CA (US)

(72) Inventors: Ravi Pillarisetty, Portland, OR (US); Hubert C. George, Portland, OR (US); Nicole K. Thomas, Portland, OR (US); Jeanette M. Roberts, North Plains, OR (US); Roman Caudillo, Portland, OR (US); Zachary R. Yoscovits, Beaverton, OR (US); Kanwaljit Singh, Rotterdam (NL); Roza Kotlyar, Portland, OR (US); Patrick H. Keys, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/650,299

(22) PCT Filed: Dec. 23, 2017

(86) PCT No.: PCT/US2017/068367
§ 371 (c)(1),
(2) Date: Mar. 24, 2020

(87) PCT Pub. No.: WO2019/125499
PCT Pub. Date: Jun. 27, 2019

(65) Prior Publication Data
US 2020/0321436 A1 Oct. 8, 2020

Related U.S. Application Data

(63) Continuation of application No. PCT/US2017/068367, filed on Dec. 23, 2017.

(51) Int. Cl.
*H01L 29/15* (2006.01)
*G06N 10/00* (2019.01)
*B82Y 10/00* (2011.01)

(52) U.S. Cl.
CPC .......... *H01L 29/158* (2013.01); *G06N 10/00* (2019.01); *B82Y 10/00* (2013.01)

(58) Field of Classification Search
CPC .......... H01L 29/158; H01L 21/823437; H01L 27/088; H01L 29/4238; H01L 29/423;
(Continued)

(56) References Cited

U.S. PATENT DOCUMENTS

| 2010/0181551 A1 | 7/2010 | Holme et al. |
| 2012/0074386 A1 | 3/2012 | Rachmady et al. |

(Continued)

FOREIGN PATENT DOCUMENTS

| WO | 2017213646 A1 | 12/2017 |
| WO | 2019125499 A1 | 6/2019 |

OTHER PUBLICATIONS

PCT Sep. 21, 2018 International Search Report and Written Opinion of the International Searching Authority for International Application No. PCT/US2017/068367; 15 pages.

(Continued)

*Primary Examiner* — Syed I Gheyas
(74) *Attorney, Agent, or Firm* — Patent Capital Group

(57) ABSTRACT

Quantum dot devices, and related systems and methods, are disclosed herein. In some embodiments, a quantum dot device may include a quantum well stack; a plurality of first gates above the quantum well stack; and a plurality of second gates above the quantum well stack; wherein the plurality of first gates are arranged in electrically continuous first rows and the plurality of second gates are arranged in electrically continuous second rows parallel to the first rows.

(Continued)

Quantum dot devices according to various embodiments of the present disclosure are based on arranging first and second gates in hexagonal/honeycomb arrays.

19 Claims, 11 Drawing Sheets

(58) Field of Classification Search
CPC . H01L 29/045; H01L 29/66977; G06N 10/00; B82Y 10/00
See application file for complete search history.

(56) References Cited

U.S. PATENT DOCUMENTS

| | | |
|---|---|---|
| 2013/0221330 A1* | 8/2013 | Choi ................ H01L 29/66439 257/39 |
| 2013/0264617 A1 | 10/2013 | Joshi et al. |
| 2015/0364545 A1 | 12/2015 | Heo et al. |
| 2016/0060122 A1 | 3/2016 | Tour et al. |
| 2016/0149051 A1 | 5/2016 | Zhang |
| 2017/0317203 A1* | 11/2017 | Petta ............... H01L 31/035236 |
| 2019/0006572 A1 | 1/2019 | Falcon et al. |
| 2019/0130298 A1* | 5/2019 | Pioro-Ladriere ........................... H01L 29/66439 |
| 2019/0131511 A1 | 5/2019 | Clarke et al. |
| 2019/0140073 A1 | 5/2019 | Pillarisetty et al. |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0221659 A1 | 7/2019 | George et al. |
| 2019/0229188 A1 | 7/2019 | Clarke et al. |
| 2019/0229189 A1 | 7/2019 | Clarke et al. |
| 2019/0252377 A1 | 8/2019 | Clarke et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0273197 A1 | 9/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0363181 A1 | 11/2019 | Pillarisetty et al. |
| 2019/0363239 A1 | 11/2019 | Yoscovits et al. |

OTHER PUBLICATIONS

"Embracing the quantum limit in silicon computing," Morton et al, Macmillan Publishers, Nov. 17, 2011, vol. 479, Nature, pp. 345-353.
"Independent, extensible control of same-frequency superconducting qubits by selective broadcasting," Asaad et al., Netherlands Organisation for Applied Scientific Research, Aug. 28, 2015, 17 pages.
"Magnetic field tuning of coplanar waveguide resonators," Healey, et al., Applied Physics Letters 93, 043513 (2008), pp. 043513-1 through 3 (4 pages with cover sheet).
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Scalable quantum circuit and control for a superconducting surface code," Versluis et al, Netherlands Organisation for Applied Scientific Research, Dec. 28, 2016, 9 pages.
"Surface loss simulations of superconducting coplanar waveguide resonators," Wenner et al, Applied Physics Letters 99, 113513 (2011), pp. 113513-1 through 3.
"Suspending superconducting qubits by silicon micromachining," Chu et al., Department of Applied Physics, Yale University, Jun. 10, 2016, 10 pages.

* cited by examiner

146 → 155-1 / 137-1 / 154-1 / 152-1 / 155-3 / 152-2 / 154-2 / 137-2 / 155-2 / 176 ically different from that of classical computers (i.e. computers that use phenomena of classical physics). Therefore, both the industry and the academics continue to focus on a search for new and improved physical systems whose functionality could approach that expected of theoretically designed qubits.

HEXAGONAL ARRAYS FOR QUANTUM DOT DEVICES

CROSS-REFERENCE TO RELATED APPLICATION

This application is a national stage application under 35 U.S.C. § 371 of PCT International Application Serial No. PCT/US2017/068367, filed Dec. 23, 2017 and entitled "HEXAGONAL ARRAYS FOR QUANTUM DOT DEVICES," which is hereby incorporated by reference herein in its entirety.

TECHNICAL FIELD

This disclosure relates generally to the field of quantum computing, and more specifically, to quantum dot devices for use in quantum circuits.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being below 100. One of the main challenges resides in protecting qubits from decoherence so that they can stay in their information-holding states long enough to perform the necessary calculations and read out the results.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2E illustrate various embodiments of a quantum well stack that may be included in a quantum dot device, in accordance with various embodiments.

DETAILED DESCRIPTION

Overview

Figure 1A:
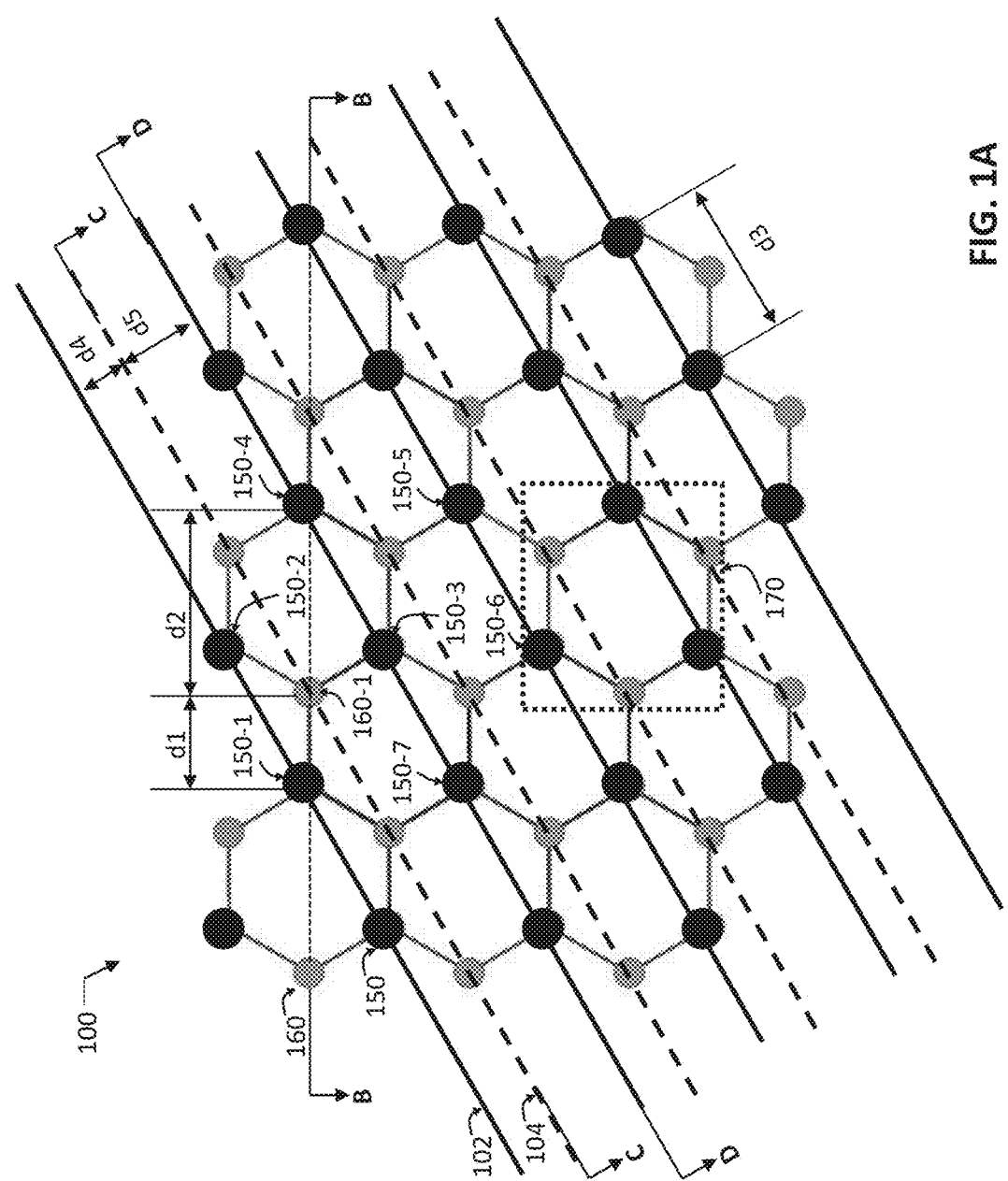
FIGS. 1A-1D are various views of a quantum dot device, in accordance with various embodiments of the present disclosure.

As briefly described above, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from that of classical computers (i.e. computers that use phenomena of classical physics). Therefore, both the industry and the academics continue to focus on a search for new and improved physical systems whose functionality could approach that expected of theoretically designed qubits.

Physical systems for implementing qubits that have been explored until now include e.g. quantum dot qubits, superconducting qubits, single trapped ion qubits, photon polarization qubits, etc. Out of the various physical implementations of qubits, quantum dot qubit devices are promising candidates for building a quantum computer.

Embodiments of the present disclosure provide improved layouts for quantum dot devices employing quantum dot qubits. To that end, various quantum dot devices, and related systems and methods, are disclosed herein. In some embodiments, a quantum dot device may include a quantum well stack; a plurality of first gates above the quantum well stack; and a plurality of second gates above the quantum well stack; wherein an individual second gate is in between an individual second-nearest neighbor pair of first gates. In some embodiments, a quantum dot device may include a quantum well stack; a plurality of first gates above the quantum well stack; and a plurality of second gates above the quantum well stack, wherein the plurality of first gates are arranged in electrically continuous first rows and the plurality of second gates are arranged in electrically continuous second rows parallel to the first rows. In some embodiments, a quantum dot device may include a quantum well stack; and a plurality of gates arranged as points in an array (which may also be considered a "grid") above the quantum well stack, wherein the array is such that an individual gate of the plurality of gates has less than four nearest neighbors. Quantum dot devices according to various embodiments of the present disclosure are based on arranging first and second gates in hexagonal arrays, i.e. arrays which result from hexagonal tiling or hexagonal tessellation in which three hexagons meet at each vertex. Such arrays are sometimes interchangeable referred to as "honeycomb" arrays.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of exemplary structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as e.g. not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, the accompanying drawings are not necessarily drawn to scale. For ease of discussion, all of the lettered sub-figures associated with a particular numbered figure may be referred to by the number of that figure; for example, FIGS. 1A-1D may be referred to as "FIG. 1," etc.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

While the disclosure may use the singular term "layer," the term "layer" should be understood to refer to assemblies that may include multiple different material layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Similarly, terms indicating orientation of various elements, such as e.g. "coplanar," "perpendicular," "orthogonal," "parallel," or any other angle between the elements, generally refer to being within +/−5-10% of a target value based on the context of a particular value as described herein or as known in the art. Furthermore, as used herein, terms indicating what may be considered an idealized behavior, such as e.g. "superconducting" or "lossless", are intended to cover functionality that may not be exactly ideal but is within acceptable margins for a given application. For example, a certain level of loss, either in terms of non-zero electrical resistance or non-zero amount of spurious two-level systems may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature at which the qubits are typically operated. In addition, techniques for the control and measurement of microwaves are well known. For these reasons, typical frequencies of qubits are in 1-10 GHz, e.g. in 3-8 GHz, range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Hexagonal Arrangements for Quantum Dot Devices

In general, quantum dot devices as described herein may be provided over any substrate which may serve as a foundation for housing quantum circuits. In one implementation, the substrate may be a crystalline substrate such as, but not limited to a silicon or a sapphire substrate, and may be provided as a wafer or a portion thereof. In other implementations, the substrate may be non-crystalline. In general, any material that provides sufficient advantages (e.g. sufficiently good electrical isolation and/or ability to apply known fabrication and processing techniques) to outweigh the possible disadvantages (e.g. negative effects of various defects), and that may serve as a foundation upon which a quantum circuit may be built, falls within the spirit and scope of the present disclosure. Additional examples of substrates which may serve as the substrate on which the quantum dot devices as described herein may be fabricated include silicon-on-insulator (Sol) substrates, III-V substrates, and quartz substrates.

Figure 1B:
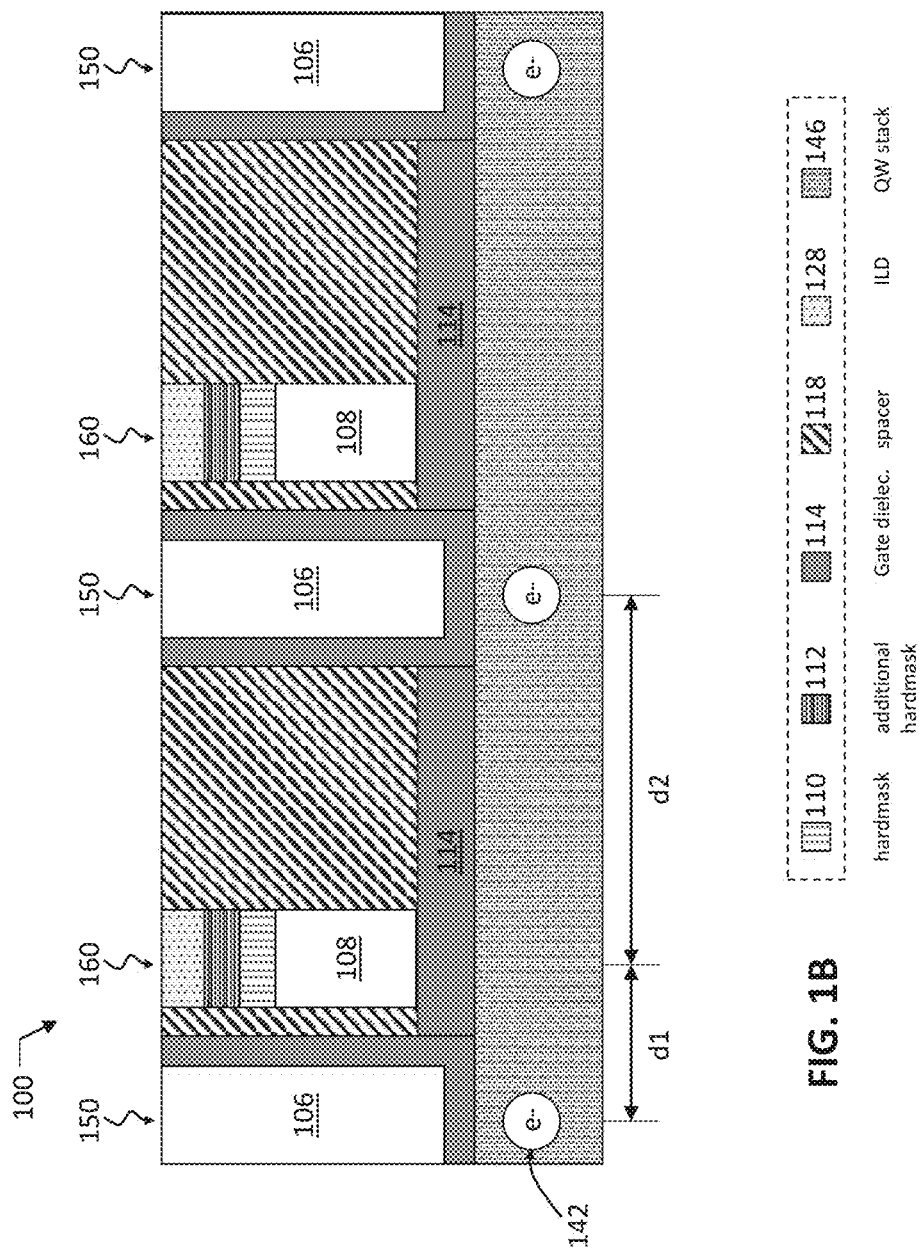
Figure 1C:
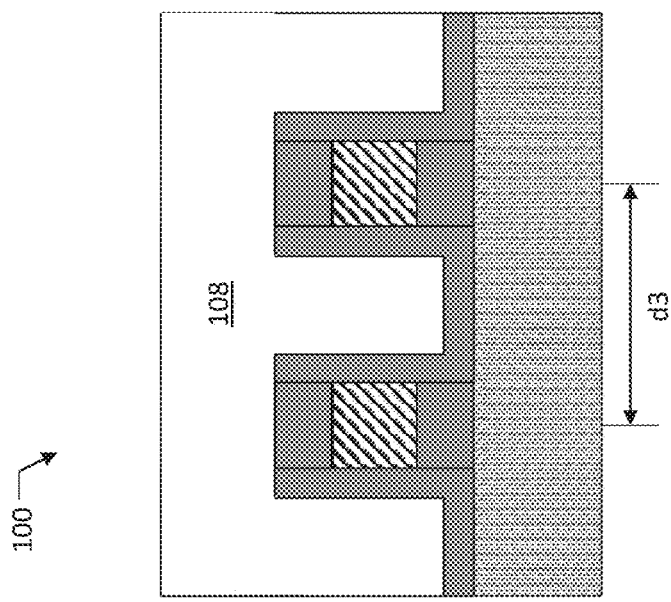
Figure 1D:
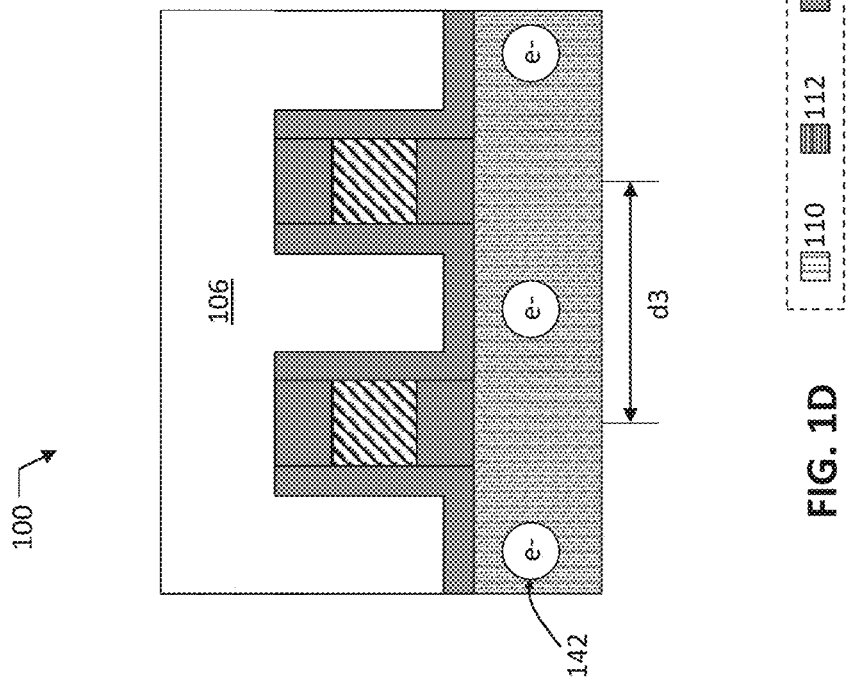

FIGS. 1A-1D are various views of a quantum dot device 100, in accordance with various embodiments. FIG. 1A is a schematic illustration of a top view of a portion of the quantum dot device 100 with some of the materials removed so that the quantum dot (QD) gate lines 102 and barrier gate lines 104 are visible. FIGS. 1B-1D are side cross-sectional views of a quantum dot device 100. In particular, FIG. 1B is a view through the section B-B of FIG. 1A, FIG. 1C is a view through the section C-C of FIG. 1A, and FIG. 1D is a view through the section D-D of FIG. 1A. A legend provided within a dashed box at the bottom of FIGS. 1A-1D illustrates patterns used to indicate different elements shown in FIGS. 1A-1D, so that the FIGS. are not cluttered by many reference numerals. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa).

As used herein, during operation of the quantum dot device 100 shown in FIG. 1, electrical signals (e.g., voltages, radio frequency (RF), and/or microwave signals) may be provided to a quantum dot gate and neighboring gates) to cause a quantum dot (e.g., an electron spin-based quantum dot) to form in a quantum well stack 146 under the quantum dot gate. Electrical signals (e.g., voltages, radio frequency (RF), and/or microwave signals) may be provided to a barrier gate to control the potential energy barrier between adjacent quantum dots.

In the quantum dot device 100 of FIG. 1, a gate dielectric 114 is disposed on a quantum well stack 146. A quantum well stack 146 may include at least one quantum well layer 152 (not specifically shown in FIG. 1, but discussed below) in which quantum dots may be localized during operation of the quantum dot device 100; examples of quantum well stacks 146 are discussed below with reference to FIG. 2. The gate dielectric 114 may be any suitable material. For example, in some embodiments, the gate dielectric 114 may be silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114. In some embodiments, the gate dielectric 114 may be a multilayer gate dielectric.

Further, in the quantum dot device 100 of FIG. 1, multiple parallel lines of barrier gate metal 108 are disposed over the gate dielectric 114, and spacer material 118 is disposed over side faces of the barrier gate metal 108. In some embodiments, a patterned hardmask 110 may be disposed over the barrier gate metal 108 (with the pattern corresponding to the pattern of the barrier gate metal 108), and the spacer material 118 may extend up the sides of the hardmask 110, as e.g. shown in FIG. 1B. In some embodiments, an additional hardmask 112 may be disposed over the hardmask 110 (such that there are two hardmasks above the barrier gate metal 108), and this additional hardmask 112, and the spacer material 118 may extend up the sides of the hardmask 112, as e.g. shown in FIG. 1B. As shown in FIG. 1B, in some embodiments, additional insulating material 128 (e.g., an interlayer dielectric (ILD)) may be disposed on this additional hardmask 112. In some embodiments, insulating material 128 (e.g., an ILD) may be disposed between the two hardmasks 110 and 112. The barrier gate metal 108 may provide barrier gates during operation of the quantum dot device 100, as discussed below. Different ones of the barrier gate lines 104 may be separately electrically controlled.

Multiple parallel lines of quantum dot (OD) gate metal 106 may be disposed over the gate dielectric 114. As shown, the lines of quantum dot gate metal 106 may be arranged parallel to the lines of barrier gate metal 108. As illustrated in FIG. 1B, the quantum dot gate metal 106 may extend down into the space between adjacent ones of the barrier gate metal 108/spacer material 118 structures. The quantum dot gate metal 106 that extends between adjacent ones of the barrier gate metal 108/spacer material 118 structures may provide a quantum dot gate 150 (only a single quantum dot gate 150 is labeled in FIG. 1A, but all similar black dots shown in FIG. 1A are intended to illustrate the quantum dot gates 150) during operation of the quantum dot device 100 such that quantum dots form in the quantum well stack 146 below the quantum dot gates 150, as discussed below. Multiple ones of the quantum dot gates 150 in a quantum dot gate line 102 are electrically continuous due to the continuous quantum dot gate metal 106; different ones of the quantum dot gate lines 102 may be separately electrically controlled. Similarly, the barrier gate metal 108 that extends between adjacent ones of the quantum dot gate metal 106/dielectric material 114 structures may provide a barrier gate 160 (only a single barrier gate 160 is labeled in FIG. 1A, but all similar grey dots shown in FIG. 1A are intended to illustrate the barrier gates 160) during operation of the quantum dot device 100, as described below. Multiple ones of the barrier gates 160 in a barrier gate line 104 are electrically continuous due to the continuous barrier gate metal 108; different ones of the barrier gate lines 104 may be separately electrically controlled.

Any suitable materials may be used in various ones of the embodiments disclosed herein. For example, in some embodiments, any of the gate metals (e.g., the barrier gate metal 108 and/or the quantum dot gate metal 106) may be a superconductor, such as aluminum, titanium nitride (e.g., deposited via atomic layer deposition), or niobium titanium nitride. The spacer materials (e.g., the spacer material 118) may be any suitable material, such as a carbon-doped oxide, silicon nitride, silicon oxide, or other carbides or nitrides (e.g., silicon carbide, silicon nitride doped with carbon, and silicon oxynitride). The insulating materials 128 may include silicon oxide, silicon nitride, aluminum oxide, carbon-doped oxide, and/or silicon oxynitride, for example. Hardmasks (e.g., the hardmasks 110 and 112) may be formed of silicon nitride, silicon carbide, or another suitable material.

Although FIG. 1 illustrates a particular number of quantum dot gate lines 102, barrier gate lines 104, quantum dot gates 150, and barrier gates 160, this is simply for illustrative purposes, and any number of quantum dot gate lines 102, barrier gate lines 104, quantum dot gates 150, and barrier gates 160 may be included in a quantum dot device 100. Electrical interconnects (e.g., vias and conductive lines) may make contact with the quantum dot gate lines 102 and barrier gate lines 104 in any desired manner, all of which being within the scope of the present disclosure. Examples of methods of performing quantum operations with the quantum dot device 100 of FIG. 1 (or similar devices) are discussed below.

Not illustrated in FIG. 1 are accumulation regions which may be electrically coupled to the quantum well layer of the quantum well stack 146. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the quantum dot gates (e.g., by controlling the voltages on the quantum dot gates and the barrier gates 160) to form carrier-based quantum dots (e.g., electron or hole quantum dots). In other embodiments (e.g., as discussed below with reference to FIG. 2), a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

FIGS. 2A-2E illustrate various examples of quantum well stacks 146 that may provide the quantum well stacks 146 of any of the embodiments of the quantum dot devices 100 disclosed herein. In some embodiments, the layers of the quantum well stacks 146 may be grown on a substrate (e.g., a silicon or germanium wafer) (and on each other) by epitaxy. Although the quantum well stacks 146 illustrated in FIG. 2 each include two quantum well layers 152 (e.g., as appropriate for a double-sided device, as discussed below with reference to FIG. 4), in some embodiments, the quantum well stack 146 included in a quantum dot device 100 may include one quantum well layer 152 or more than two quantum well layers 152; elements may be omitted from the quantum well stacks 146, or added to the quantum well stacks 146, discussed with reference to FIG. 2 to achieve such embodiments, as appropriate. Layers other than the quantum well layer(s) 152 in a quantum well stack 146 may have higher threshold voltages for conduction than the quantum well layer(s) 152 so that when the quantum well layer(s) 152 are biased at their threshold voltages, the quantum well layer(s) 152 conduct and the other layers of the quantum well stack 146 do not. This may avoid parallel conduction in both the quantum well layer(s) 152 and the other layers, and thus avoid compromising the strong mobility of the quantum well layer(s) 152 with conduction in layers having inferior mobility.

FIG. 2A is a cross-sectional view of a quantum well stack 146 including only a quantum well layer 152-1, a barrier layer 154, and a quantum well layer 152-2. In some embodiments, the quantum well layers 152 of FIG. 2A may be formed of intrinsic silicon, and the gate dielectrics 114 may be formed of silicon oxide; in such an arrangement, during use of the quantum dot device 100, a two-dimensional electron gas (2DEG) may form in the intrinsic silicon at the interface between the intrinsic silicon and the proximate silicon oxide. Embodiments in which the quantum well layers 152 of FIG. 2A are formed of intrinsic silicon may be particularly advantageous for electron-type quantum dot devices 100. In some embodiments, the quantum well layers 152 of FIG. 2A may be formed of intrinsic germanium, and the gate dielectrics 114 may be formed of germanium oxide; in such an arrangement, during use of the quantum dot device 100, a 2DEG may form in the intrinsic germanium at the interface between the intrinsic germanium and the proximate germanium oxide. Such embodiments may be particularly advantageous for hole-type quantum dot devices 100. In some embodiments, the quantum well layers 152 may be strained, while in other embodiments, the quantum well layers 152 may not be strained.

The barrier layer 154 of FIG. 2A may provide a potential barrier between the quantum well layer 152-1 and the quantum well layer 152-2. In some embodiments in which the quantum well layers 152 of FIG. 2A are formed of silicon, the barrier layer 154 may be formed of silicon germanium. The germanium content of this silicon germanium may be about 20-80% (e.g., about 30%). In some embodiments in which the quantum well layers 152 are formed of germanium, the barrier layer 154 may be formed of silicon germanium (with a germanium content of about 20-80% (e.g., about 70%)).

The thicknesses (i.e., z-heights) of the layers in the quantum well stack 146 of FIG. 2A may take any suitable values. For example, in some embodiments, the thickness of the barrier layer 154 (e.g., silicon germanium) may be between about 0 and 400 nanometers. In some embodiments, the thickness of the quantum well layers 152 (e.g., silicon or germanium) may be between about 5 and 30 nanometers.

FIG. 2B is a cross-sectional view of a quantum well stack 146 including quantum well layers 152-1 and 152-2, a barrier layer 154-2 disposed between the quantum well layers 152-1 and 152-2, and additional barrier layers 154-1 and 154-3. In the quantum dot device 100, the barrier layer 154-1 may be disposed between the quantum well layer 152-1 and the gate dielectric 114-1 (see, e.g., FIG. 4). The barrier layer 154-3 may be disposed between the quantum well layer 152-2 and the gate dielectric 114-2 (see, e.g., FIG. 4). In some embodiments, the barrier layer 154-3 may be formed of a material (e.g., silicon germanium), and when the quantum well stack 146 is being grown on the substrate 144, the barrier layer 154-3 may include a buffer region of that material. This buffer region may trap defects that form in this material as it is grown on the substrate 144, and in some embodiments, the buffer region may be grown under different conditions (e.g., deposition temperature or growth rate) from the rest of the barrier layer 154-3. In particular, the rest of the barrier layer 154-3 may be grown under conditions that achieve fewer defects than the buffer region. In some embodiments, the buffer region may be lattice mismatched with the quantum well layer(s) 152 in a quantum well stack 146, imparting biaxial strain to the quantum well layer(s) 152.

The barrier layers 154-1 and 154-3 may provide potential energy barriers around the quantum well layers 152-1 and 152-2, respectively, and the barrier layer 154-1 may take the form of any of the embodiments of the barrier layer 154-3 discussed herein. In some embodiments, the barrier layer 154-1 may have a similar form as the barrier layer 154-3, but may not include a "buffer region" as discussed above; in the quantum dot device 100, the barrier layer 154-3 and the barrier layer 154-1 may have substantially the same structure. The barrier layer 154-2 may take the form of any of the embodiments of the barrier layer 154 discussed above with reference to FIG. 2A. The thicknesses (i.e., z-heights) of the layers in the quantum well stack 146 of FIG. 2B may take any suitable values. For example, in some embodiments, the thickness of the barrier layers 154-1 and 154-3 (e.g., silicon germanium) in the quantum dot device 100 may be between about 0 and 400 nanometers. In some embodiments, the thickness of the quantum well layers 152 (e.g., silicon or germanium) may be between about 5 and 30 nanometers (e.g., about 10 nanometers). In some embodiments, the thickness of the barrier layer 154-2 (e.g., silicon germanium) may be between about 25 and 75 nanometers (e.g., about 32 nanometers).

FIGS. 2C-2D illustrate examples of quantum well stacks 146 including doped layer(s) 137. As noted above, doped layer(s) 137 may be included in a quantum well stack 146 instead of or in addition to an accumulation region 162.

FIG. 2C is a cross-sectional view of a quantum well stack 146 including a buffer layer 176, a barrier layer 155-2, a quantum well layer 152-2, a barrier layer 154-2, a doped layer 137, a barrier layer 154-1, a quantum well layer 152-1, and a barrier layer 155-1.

The buffer layer 176 may be formed of the same material as the barrier layer 155-2, and may be present to trap defects that form in this material as it is grown. In some embodiments, the buffer layer 176 may be grown under different conditions (e.g., deposition temperature or growth rate) from the barrier layer 155-2. In particular, the barrier layer 155-2 may be grown under conditions that achieve fewer defects than the buffer layer 176. In some embodiments in which the buffer layer 176 includes silicon germanium, the silicon germanium of the buffer layer 176 may have a germanium content that varies to the barrier layer 155-2; for example, the silicon germanium of the buffer layer 176 may have a germanium content that varies from zero percent to a nonzero percent (e.g., about 30%) at the barrier layer 155-2. The buffer layer 176 may be grown beyond its critical layer thickness such that it is substantially free of stress from the underlying base (and thus may be referred to as "relaxed"). In some embodiments, the thickness of the buffer layer 176 (e.g., silicon germanium) may be between about 0.3 and 4 microns (e.g., about 0.3-2 microns, or 0.5 microns). In some embodiments, the buffer layer 176 may be lattice mismatched with the quantum well layer(s) 152 in a quantum well stack 146, imparting biaxial strain to the quantum well layer(s) 152.

The barrier layer 155-2 may provide a potential energy barrier proximate to the quantum well layer 152-2. The barrier layer 155-2 may be formed of any suitable materials. For example, in some embodiments in which the quantum well layer 152 is formed of silicon or germanium, the barrier layer 155-2 may be formed of silicon germanium. In some embodiments, the thickness of the barrier layer 155-2 may be between about 0 and 400 nanometers (e.g., between about 25 and 75 nanometers).

The quantum well layer 152-2 may be formed of a different material than the barrier layer 155-2. Generally, a quantum well layer 152 may be formed of a material such that, during operation of the quantum dot device 100, a 2DEG may form in the quantum well layer 152. Embodiments in which the quantum well layer 152 is formed of intrinsic silicon may be particularly advantageous for electron-type quantum dot devices 100. Embodiments in which a quantum well layer 152 is formed of intrinsic germanium may be particularly advantageous for hole-type quantum dot devices 100. In some embodiments, a quantum well layer 152 may be strained, while in other embodiments, a quantum well layer 152 may not be strained. The thickness of a quantum well layer 152 may take any suitable values; in some embodiments, a quantum well layer 152 may have a thickness between about 5 and 30 nanometers.

In the quantum well stack 146 of FIG. 2C, the doped layer 137 may be "shared" by the two quantum well layers 152 in the quantum well stack 146, in that the doped layer 137 provides carriers to the quantum well layer 152-1 and the quantum well layer 152-2 during use. In the quantum dot device 100, the quantum well layer 152-1 may be disposed between the doped layer 137 and the gate dielectric 114-1, while the quantum well layer 152-2 may be disposed between the doped layer 137 and the gate dielectric 114-2. The doped layer 137 of FIG. 2C may be doped with an n-type material (e.g., for an electron-type quantum dot device 100) or a p-type material (e.g., for a hole-type quantum dot device 100). In some embodiments, the doping concentration of the doped layer 137 may be between about $10^{17}/cm^3$ and $10^{20}/cm^3$ (e.g., between about $10^{17}/cm^3$ and $10^{18}/cm^3$). The thickness (i.e., z-height) of the doped layer 137 may depend on the doping concentration, among other factors, and in some embodiments, may be between about 5 and 50 nanometers (e.g., between about 20 and 30 nanometers).

A doped layer 137 may be formed using any of a number of techniques. In some embodiments, a doped layer 137 may be formed of an undoped base material (e.g., germanium) that is doped in situ during growth of the base material by epitaxy. In some embodiments, a doped layer 137 may initially be fully formed of an undoped base material (e.g., silicon germanium), then a layer of dopant may be deposited on this base material (e.g., a monolayer of the desired dopant), and an annealing process may be performed to drive the dopant into the base material. In some embodiments, a doped layer 137 may initially be fully formed of an undoped base material (e.g., silicon germanium), and the dopant may be implanted into the lattice (and, in some embodiments, may be subsequently annealed). In some embodiments, a doped layer 137 may be provided by a silicon germanium layer (e.g., with about 90% germanium content) doped with an n-type dopant. In general, any suitable technique may be used to form a doped layer 137.

The barrier layer 154-2 may not be doped, and thus may provide a barrier to prevent impurities in the doped layer 137 from diffusing into the quantum well layer 152-2 and forming recombination sites or other defects that may reduce channel conduction and thereby impede performance of the quantum dot device 100. In some embodiments of the quantum well stack 146 of FIG. 2C, the doped layer 137 may include a same material as the barrier layer 154-2, but the barrier layer 154-2 may not be doped. For example, in some embodiments, the doped layer 137 and the barrier layer 154-2 may both be silicon germanium. In some embodiments in which the quantum well layer 152-2 is formed of silicon, the barrier layer 154-2 may be formed of silicon germanium. The germanium content of this silicon germanium may be about 20-80% (e.g., about 30%). In some embodiments in which the quantum well layer 152-2 is formed of germanium, the barrier layer 154-2 may be formed of silicon germanium (with a germanium content of about 20-80% (e.g., about 70%)). The thickness of the barrier layer 154-2 may depend on the doping concentration of the doped layer 137, among other factors discussed below, and in some embodiments, may be between about 5 and 50 nanometers (e.g., between about 20 and 30 nanometers).

The barrier layer 154-1 may provide a barrier to prevent impurities in the doped layer 137 from diffusing into the quantum well layer 152-1, and may take any of the forms described herein for the barrier layer 154-2. Similarly, the quantum well layer 152-1 may take any of the forms described herein for the quantum well layer 152-2. The barrier layer 155-1 may provide a potential energy barrier proximate to the quantum well layer 152-1 (as discussed above with reference to the barrier layer 155-2 and the quantum well layer 152-2), and may take any of the forms described herein for the barrier layer 155-2.

The thickness of a barrier layer 154 may impact the ease with which carriers in the doped layer 137 can move into a quantum well layer 152 disposed on the other side of the barrier layer 154. The thicker the barrier layer 154, the more difficult it may be for carriers to move into the quantum well layer 152; at the same time, the thicker the barrier layer 154, the more effective it may be at preventing impurities from the doped layer 137 from moving into the quantum well layer 152. Additionally, the diffusion of impurities may depend on the temperature at which the quantum dot device 100 operates. Thus, the thickness of the barrier layer 154 may be adjusted to achieve a desired energy barrier and impurity screening effect between the doped layer 137 and the quantum well layer 152 during expected operating conditions.

In some embodiments of the quantum well stack 146 of FIG. 2C (e.g., those included in "single-sided" quantum dot devices 100), only a single quantum well layer 152 may be included. For example, the layers 154-1 and 152-1 may be omitted, and gates may be formed proximate to the barrier layer 155-1 such that the quantum well layer 152-1 is disposed between the gates and the doped layer 137. In other embodiments, the layers 154-1, 152-1, and 155-2 may be omitted, and gates may be formed proximate to the doped layer 137. In some embodiments, the buffer layer 176 and/or the barrier layer 155-2 may be omitted from the quantum well stack 146 of FIG. 2C.

FIG. 2D is a cross-sectional view of a quantum well stack 146 that is similar to the quantum well stack 146 of FIG. 2C, except that in the place of the single doped layer 137 shared by two quantum well layers 152, the quantum well stack 146 of FIG. 2D includes two different doped layers 137-2 and 137-1 (spaced apart by a barrier layer 155-3). In such an embodiment, the doped layer 137-2 may provide a source of carriers for the quantum well layer 152-2, and the doped layer 137-1 may provide a source of carriers for the quantum well layer 152-1. The barrier layer 155-3 may provide a potential barrier between the two doped layers 137, and may take any suitable form. Generally, the elements of the quantum well stack 146 of FIG. 2D may take the form of any of the corresponding elements of the quantum well stack 146 of FIG. 2C. The doped layers 137-1 and 137-2 may have the same geometry and material composition, or may have different geometries and/or material compositions.

FIG. 2E is a cross-sectional view of a quantum well stack 146 in which two doped layers 137-1 and 137-2 are disposed toward the "outside" of the quantum well stack 146, rather than the "inside" of the quantum well stack 146, as illustrated in FIGS. 2C and 2D. In particular, the quantum well layer 152-2 is disposed between the doped layer 137-2 and the quantum well layer 152-1, and the quantum well layer 152-1 is disposed between the doped layer 137-1 and the quantum well layer 152-2. In the quantum dot device 100, the doped layer 137-1 may be disposed between the quantum well layer 152-1 and the gate dielectric 114-1, while the doped layer 137-2 may be disposed between the quantum well layer 152-2 and the gate dielectric 114-2. In the quantum well stack 146 of FIG. 2E, a barrier layer 155-3 provides a potential barrier between the quantum well layers 152-1 and 152-2 (rather than between the doped layers 137-1 and 137-2, as illustrated in the quantum well stack 146 of FIG. 2D), Generally, the elements of the quantum well stack 146 of FIG. 2E may take the form of any of the corresponding elements of the quantum well stack 146 of FIGS. 2A-D.

In some particular embodiments in which the quantum dot device 100 is a "single-sided" device with only one set of gates, the quantum well stack 146 may include a silicon base, a buffer layer 176 of silicon germanium (e.g., with 30% germanium content), then a doped layer 137 formed of silicon germanium doped with an n-type dopant, a thin barrier layer 154 formed of silicon germanium e.g., silicon germanium with 70% germanium content), a silicon quantum well layer 152, and a barrier layer 155 formed of silicon germanium (e.g., with 30% germanium content); in such an embodiment, the gates may be disposed on the barrier layer 155. In some other particular embodiments in which the quantum dot device 100 is a "single-sided" device with only one set of gates, the quantum well stack 146 may include a silicon base, a doped layer 137 formed of silicon doped with an n-type dopant, a thin barrier layer 154 formed of silicon germanium, and a silicon quantum well layer 152; in such an embodiment, the gates may be disposed on the silicon quantum well layer 152.

Turning back to FIG. 1, FIG. 1A schematically illustrates a two-dimensional arrangement of the barrier gates 160 and the quantum dot gates 150 in the quantum dot device 100. In particular, in some embodiments, multiple ones of the barrier gates 160 illustrated in FIG. 1A as connected by the barrier gate line 104 may physically take the form of a single elongated barrier gate, while multiple ones of the quantum dot gates 150 illustrated in FIG. 1A as connected by a quantum dot gate line 102 may physically take the form of a single elongated quantum dot gate.

In FIG. 1A, barrier gates 160 arranged along a barrier gate line 104 are electrically continuous, and thus any voltage applied to a barrier gate line 104 will be applied to all of the barrier gates 160 along that line. Similarly, quantum dot gates 150 arranged along a quantum dot gate line 102 are electrically continuous, and thus any voltage applied to a quantum dot gate line 102 will be applied to all of the quantum dot gates 150 along that line. In the quantum dot device 100 of FIG. 1A, the barrier gate lines 104 are parallel to each other, the quantum dot gate lines 102 are parallel to each other, and the barrier gate lines 104 are parallel to the quantum dot gate lines 102.

The quantum dot gates 150 in the quantum dot device 100 of FIG. 1A are arranged as points in a grid, and different ones of the quantum dot gate lines 102 are electrically coupled to different diagonals in that grid, which diagonals shown in FIG. 1A as solid lines. The barrier gates 160 in the quantum dot device 100 of FIG. 1A are also arranged as points in a grid, and different ones of the barrier gate lines 104 are electrically coupled to different diagonals in that grid, which diagonals shown in FIG. 1A as dashed lines. The grid underlying the quantum dot gates 150 is shifted with reference to the grid underlying the barrier gates 160. More specifically, the quantum dot gates 150 may be seen as arranged, as a set of points, in a first triangular lattice, and the barrier gates 160 may be seen as arranged, as a set of points, in a second triangular lattice, the second triangular lattice offset with respect to the first triangular lattice, thus together forming a hexagonal, or honeycomb, arrangement of gates. An individual honeycomb/hexagonal cell is shown in FIG. 1A within a dotted contour 170. As shown in FIG. 1A, a given honeycomb/hexagonal cell 170 includes 6 gates—three quantum dot gates 150 and three barrier gates 160.

In some embodiments, the 6 gates of a honeycomb/hexagonal cell 170 may be arranged as corners of a hexagon having all equal sides (as is shown in the example of FIG. 1A). In some embodiments of such an arrangement, each side of a hexagon (i.e. a dimension labeled in FIG. 1A as a distance d1) may be between about 10 and 100 nanometers, including all values and ranges therein, such as e.g. between about 25 and 75 nanometers, or between about 40 and 50 nanometers. Applying basic geometry, all other dimensions of such a hexagon cell 170, as well as distances between various gates of different cells 170 may be derived from the distance d1, such as e.g. distances shown as d2-d5 in FIG. 1A. For example, in some embodiments of such an arrangement, each diagonal of a hexagon connecting two vertices of the hexagon separated by two other vertices (i.e. a dimension labeled in FIG. 1A as a distance d2) as well as each diagonal of a hexagon connecting two vertices of the hexagon separated by only one other vertex (i.e. a dimension labeled in FIG. 1A as a distance d3) may be between about 15 and 250 nanometers, including all values and ranges therein, such as e.g. between about 50 and 150 nanometers, or between about 80 and 100 nanometers. In another example, the distances between the barrier gate lines 104 and quantum dot gate lines 102 may also be derived based on the dimension d1. Namely, at least for some of the barrier gate lines 104 and quantum dot gate lines 102, each barrier gate line 104 is provided between a pair of quantum dot gate lines 102, where a distance from said barrier gate line 104 to one of the pair of quantum dot gate lines 102 (i.e. a dimension labeled in FIG. 1A as a distance d4) may be smaller than a distance from said barrier gate line 104 to another one of the pair of quantum dot gate lines 102 (i.e. a dimension labeled in FIG. 1A as a distance d5). In some embodiments, the distance d4 may be between about 5 and 75 nanometers, including all values and ranges therein, such as e.g. between about 15 and 40 nanometers, or between about 20 and 30 nanometers, while the distance d5 may be between about 10 and 100 nanometers, including all values and ranges therein, such as e.g. between about 25 and 75 nanometers, or between about 40 and 50 nanometers.

In the hexagonal array of the quantum dot gates 150 and barrier gates 160 of the quantum dot device 100 of FIG. 1, each of the gates (i.e. an individual one of the quantum dot gates 150 or of the barrier gates 160) has three nearest neighbors, the nearest neighbors separated from said individual gate by the distance d1. As can be seen in FIG. 1A, for a given barrier gate 160, the nearest neighbors are all quantum dot gates 150, and vice versa. For example, for an individual barrier gate 160 shown in FIG. 1A as a barrier gate 160-1, the three nearest neighbors are quantum dot gates shown in FIG. 1A as quantum dot gates 150-1, 150-2, and 150-3, Such arrangement may be advantageous compared to arrangements where each gate has four or more nearest neighbors, because having less nearest neighbors may reduce chances of qubit decoherence. Furthermore, in the hexagonal array of the quantum dot gates 150 and barrier gates 160 of the quantum dot device 100 of FIG. 1 where each gate has 3 nearest neighbors (unless it's at the edge of the array where there may be less than 3 nearest neighbors), the second-nearest neighbors are located further away than the second-nearest neighbors in an array with 4 nearest neighbors, which may also help reducing chances of qubit decoherence. For example, for an individual quantum dot gate 150 shown in FIG. 1A as the quantum dot gate 150-3, the second-nearest neighbors of the entire array of quantum dot and barrier gates are quantum dot gates shown in FIG. 1A as quantum dot gates 150-1, 150-2, 150-4, 150-5, 150-6, and 150-7, located at a distance d3 from the quantum dot gate 150-3.

When only analyzing a triangular lattice of the quantum dot gates 150, an individual quantum dot gate 150 has 6 nearest neighbors of other quantum dot gates 150 (unless it's at the edge of the array where there may be less than 6 nearest neighbors), such nearest neighbors separated from said individual quantum dot gate 150 by the distance d3. For example, for an individual quantum dot gate 150 shown in FIG. 1A as the quantum dot gate 150-3, the six nearest neighbors of the quantum dot gate array are quantum dot gates shown in FIG. 1A as quantum dot gates 150-1, 150-2, 150-4, 150-5, 150-6, and 150-7. The same is applicable to the barrier gates 160, i.e. an individual barrier gate 160 has 6 nearest neighbors of other barrier gates 160 (unless it's at the edge of the array where there may be less than 6 nearest neighbors), such nearest neighbors separated from said individual barrier gate 160 by the distance d3.

When only analyzing a triangular lattice of the quantum dot gates 150 further, an individual quantum dot gate 150 has 6 second-nearest neighbors of other quantum dot gates 150 (unless it's at the edge of the array where there may be less than 6 second-nearest neighbors), such second-nearest neighbors separated from said individual quantum dot gate 150 by the distance that is the sum of distances d1 and d2. For example, for an individual quantum dot gate 150 shown in FIG. 1A as the quantum dot gate 150-1, two of the six nearest neighbors of the quantum dot gate array are quantum dot gates shown in FIG. 1A as the quantum dot gates 150-4 and 150-6 (other second-nearest neighbors of the quantum dot gates 150 are not labeled in FIG. 1A in order to not clutter the drawing), Notably, in the quantum dot device 100 of FIG. 1, the quantum dot gates 150 in each second-nearest neighbor pair have a barrier gate disposed between them— e.g. a pair of second-nearest neighbors quantum dot gates 1504 and 150-4 has the barrier gate 160-1 intervening between them (this is seen not only in FIG. 1A but also in FIG. 1B). The quantum dot gate lines 102 connect quantum dot gates 150 along the diagonal of the underlying grid. As discussed in further detail below, during operation of the quantum dot device 100, quantum interactions between second-nearest neighbor quantum dots under different ones of the quantum dot gates 150 may be controlled in part by the potential energy barrier provided by the intervening barrier gates 160. The same is applicable to the barrier gates 160, i.e. an individual barrier gate 160 has 6 second-nearest neighbors of other barrier gates 160 (unless it's at the edge of the array where there may be less than 6 second-nearest neighbors), such second-nearest neighbors separated from said individual barrier gate 160 by the distance that is the sum of distances d1 and d2, and the barrier gates 160 in each second-nearest neighbor pair have a quantum dot gate disposed/intervening between them.

FIGS. 1B-1D also include some example dimensions for example embodiments of the quantum dot devices 100 described above, as well as illustrating the location of quantum dots 142 (shown as "e-" electron-spin-based quantum dots) under the quantum dot gates 150.

Figure 3A:
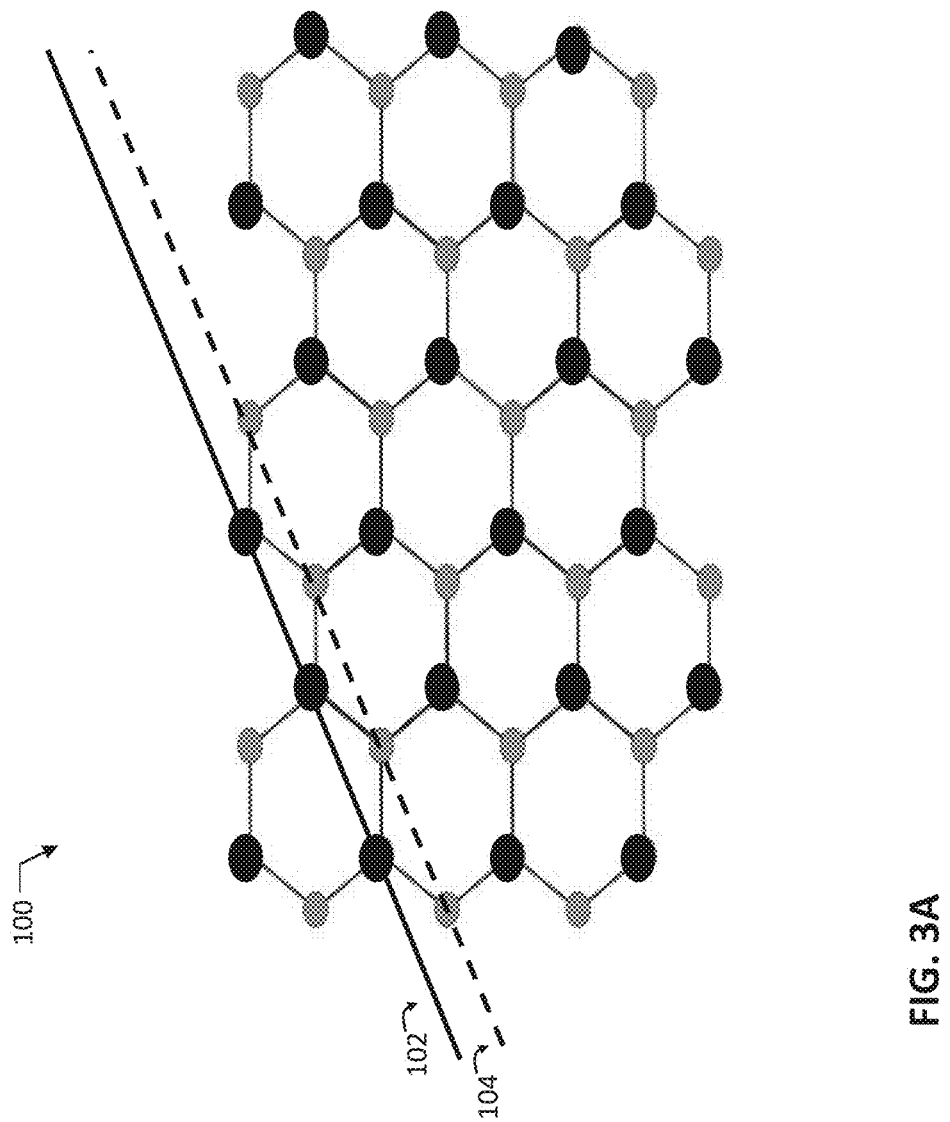
FIGS. 3A-3B are alternative implementations of a quantum dot device, in accordance with various embodiments of the present disclosure.
Figure 3B:
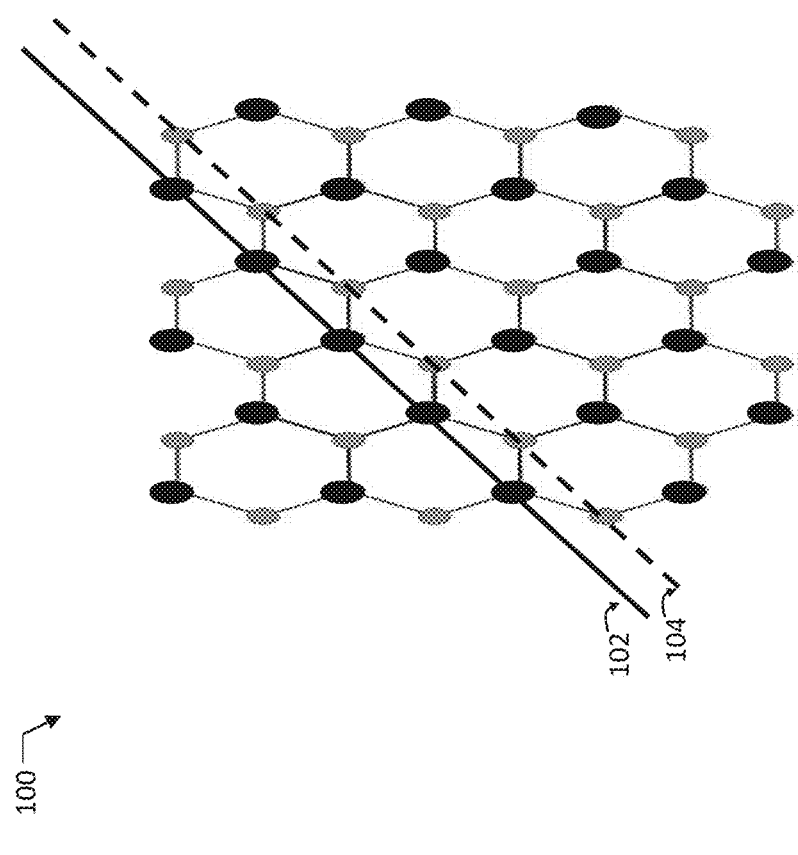

FIGS. 3A and 3B illustrate that, in some embodiments, the quantum dot array 100 may be substantially as described with reference to FIG. 1, but not having all sides of each hexagon equal to one another. For such arrangements, the ranges provided above for distances d1-d6 still apply, except that the relationships of the distances d1-d6 with one another (e.g. how each of the distances d2-d6 may be expressed in terms of the distance d1) may be different from that of the arrangement shown in FIG. 1. Other descriptions provided with respect to FIG. 1 are applicable to the alternative embodiments shown in FIGS. 3A-3B.

Figure 4:
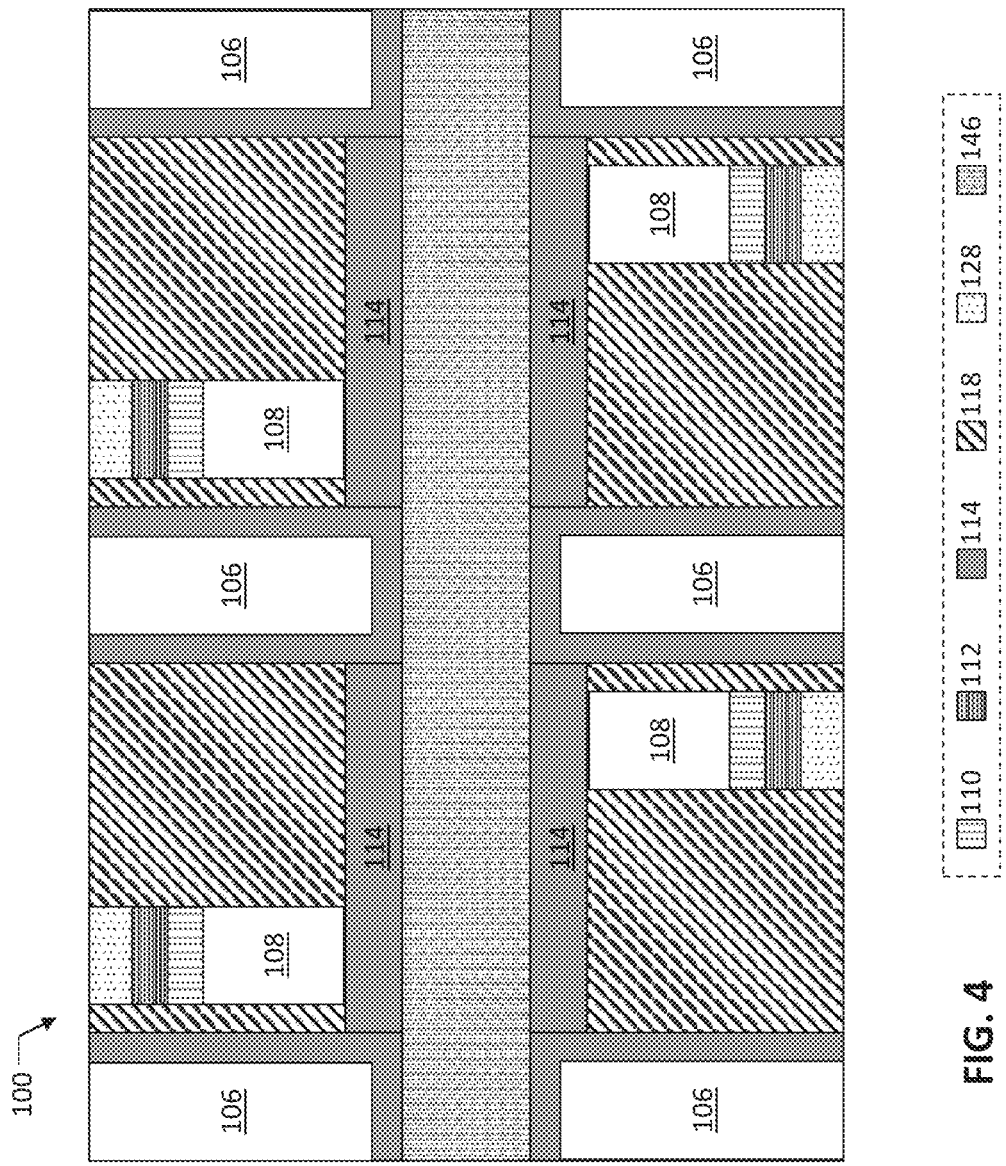
FIG. 4 illustrates a double-sided quantum dot device, in accordance with various embodiments.

FIG. 4 is a cross-sectional view of a double-sided quantum dot device 100, in accordance with various embodiments. A legend provided within a dashed box at the bottom of FIG. 4 illustrates patterns used to indicate different elements shown in this FIG. The quantum dot device 100 of FIG. 4 may be formed by fabricating the quantum dot device discussed with reference to FIG. 1, then flipping the structure over, and performing the same operations on the "other side" of the quantum well stack 146. The quantum well stack 146 may itself include two quantum well layers, one in which quantum dots may be formed by the gates on the corresponding side of the quantum well stack 146, and the other in which quantum dots may be formed by the gates on the other, corresponding side of the quantum well stack 146. In some embodiments, the quantum dots formed in one of the quantum well layers may act as the "active" quantum dots in the quantum dot device 100, and the quantum dots formed in the other of the quantum well layers may act as the "read" quantum dots, sensing the state of the active quantum dots for readout (e.g., through the corresponding gates and other interconnects). Similar double-sided quantum dot devices may be formed using the alternative arrangements of the quantum dot device as e.g. shown in FIGS. 3A-3B, all of which being within the scope of the present disclosure.

Although not specifically shown in FIGS., in some embodiments, the quantum dot device 100 may include a set of magnets above some or all of the quantum dot gates 150 such that the quantum dot gates are disposed between corresponding magnets and the quantum well stack 146. In one example arrangement of magnets in a quantum dot device 100, each magnet along a quantum dot gate line 102 may have a different associated frequency. This frequency may be engineered to take a particular value, or different magnets may have different frequencies due to process variations. Any suitable magnets may be used, and each magnet may thus act as an "antenna" for directing energy of a matching frequency to the quantum dot associated with the magnet. To perform a Pauli gate (or "NOT") operation on a particular quantum dot π, a microwave pulse (e.g., in the gigahertz range) may be applied to the quantum dot gate line that includes the quantum dot gate associated with the quantum dot π. The frequency of the microwave pulse may allow the quantum dot π to be selected by the field gradient of the associated magnet, and thus the microwave pulse may change only the state of the quantum dot π (and not other quantum dots disposed below the same quantum dot gate line 102). The voltages on the other quantum dot gate lines 102 may remain fixed, and the voltages on the barrier gate lines 104 may also remain fixed to confine the Pauli gate operation to the quantum dot π.

Exemplary Quantum Dot Devices

Quantum dot devices with gates arranged in honeycomb/hexagonal arrays as described above may be included in any kind of qubit device assemblies or quantum processing devices/structures. Some examples of such devices/structures are illustrated in FIGS. 5A-5B, 6, and 8.

Figure 5B:
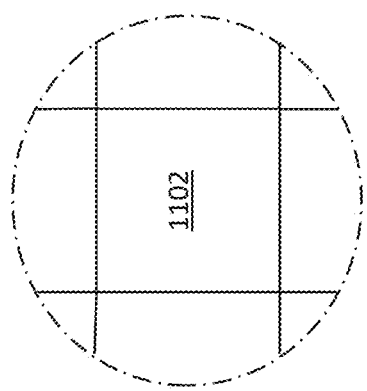
FIGS. 5A and 5B are top views of a wafer and dies that may include any of the quantum dot devices disclosed herein.
Figure 5A:
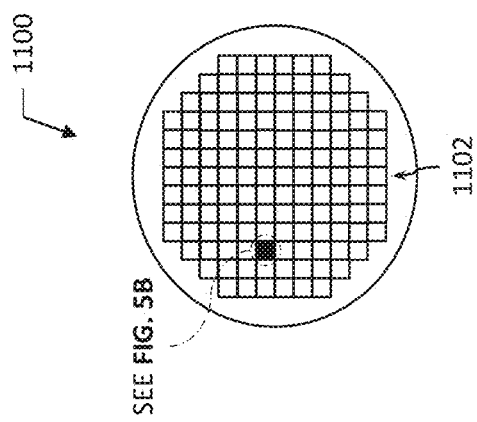

FIGS. 5A-5B are top views of a wafer 1100 and dies 1102 that may be formed from the wafer 1100, according to some embodiments of the present disclosure. The die 1102 may include any of the quantum dot devices 100 disclosed herein. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include one or more quantum circuit assemblies with quantum dots arranged in accordance with any of the layout designs described herein, as well as other IC components. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG.

7) or other logic that is configured to store information in the memory devices or execute instructions stored in the memory array.

Figure 6:
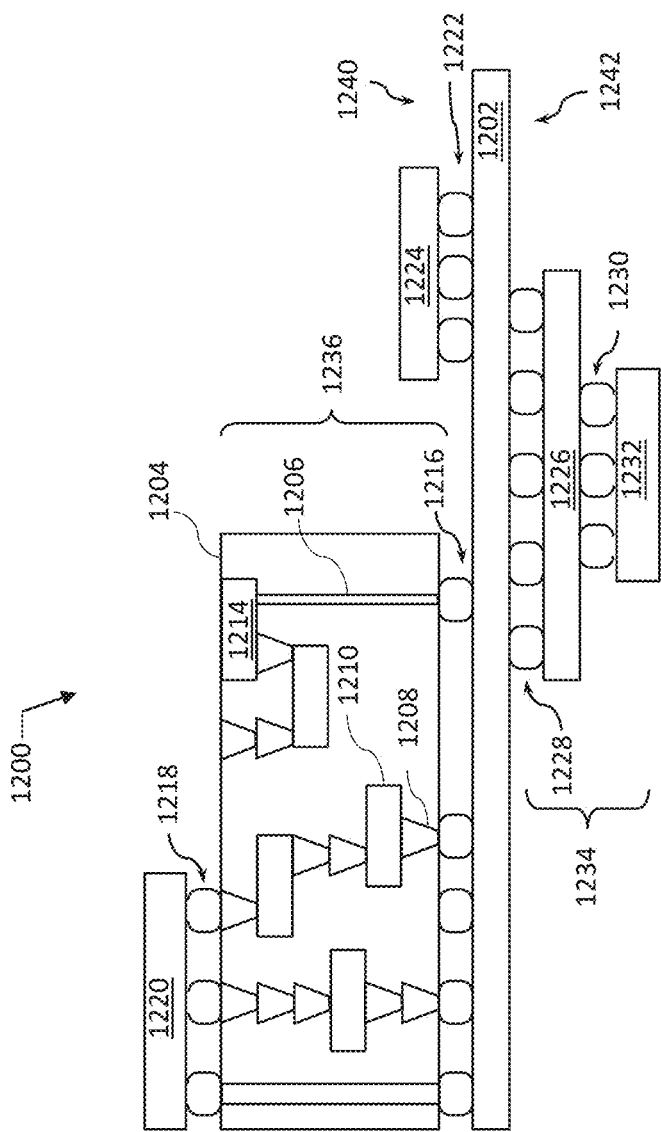
FIG. 6 is a cross-sectional side view of a device assembly that may include any of the quantum dot devices disclosed herein.

FIG. 6 is a cross-sectional side view of a device assembly 1200 that may include any of the quantum dot devices 100 described herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. Signal transfer between components or layer may happen with both low resistance DC connections or by either in-plane or out-of-plane capacitive connections. In other embodiments, the circuit board 1202 may be a package substrate or flexible board.

The IC device assembly 1200 illustrated in FIG. 6 may include a package-on-interposer structure 1236 coupled to the first face 1240 of the circuit board 1202 by coupling components 1216, The coupling components 1216 may electrically and mechanically couple the package-on-interposer structure 1236 to the circuit board 1202, and may include solder balls (as shown in FIG. 6), male and female portions of a socket, an adhesive, an underfill material, and/or any other suitable electrical and/or mechanical coupling structure. The coupling components 1216 may include other forms of electrical connections that may have no mechanical contact, such as parallel-plate capacitors or inductors, which can allow high-frequency connection between components without mechanical or DC connection.

The package-on-interposer structure 1236 may include a package 1220 coupled to an interposer 1204 by coupling components 1218. The coupling components 1218 may take any suitable form for the application, such as the forms discussed above with reference to the coupling components 1216, Although a single package 1220 is shown in FIG. 6, multiple packages may be coupled to the interposer 1204; indeed, additional interposers may be coupled to the interposer 1204. The interposer 1204 may provide an intervening substrate used to bridge the circuit board 1202 and the package 1220. In some implementations, the package 1220 may be a quantum circuit device package as described herein, e.g. a package including one or more dies with any of the quantum dot devices 100 described herein. In other implementations, the package 1220 may be a conventional IC package with non-quantum circuit assemblies. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 6, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of a crystalline material, such as silicon, germanium, or other semiconductors, an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1210 and vias 1208, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. Thus, the package 1224 may be a package including any of the quantum dot devices 100 described herein or may be a conventional IC package, for example.

The device assembly 1200 illustrated in FIG. 6 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package with any of the quantum dot devices 100 as described herein or may be a conventional IC package, for example.

Figure 7:
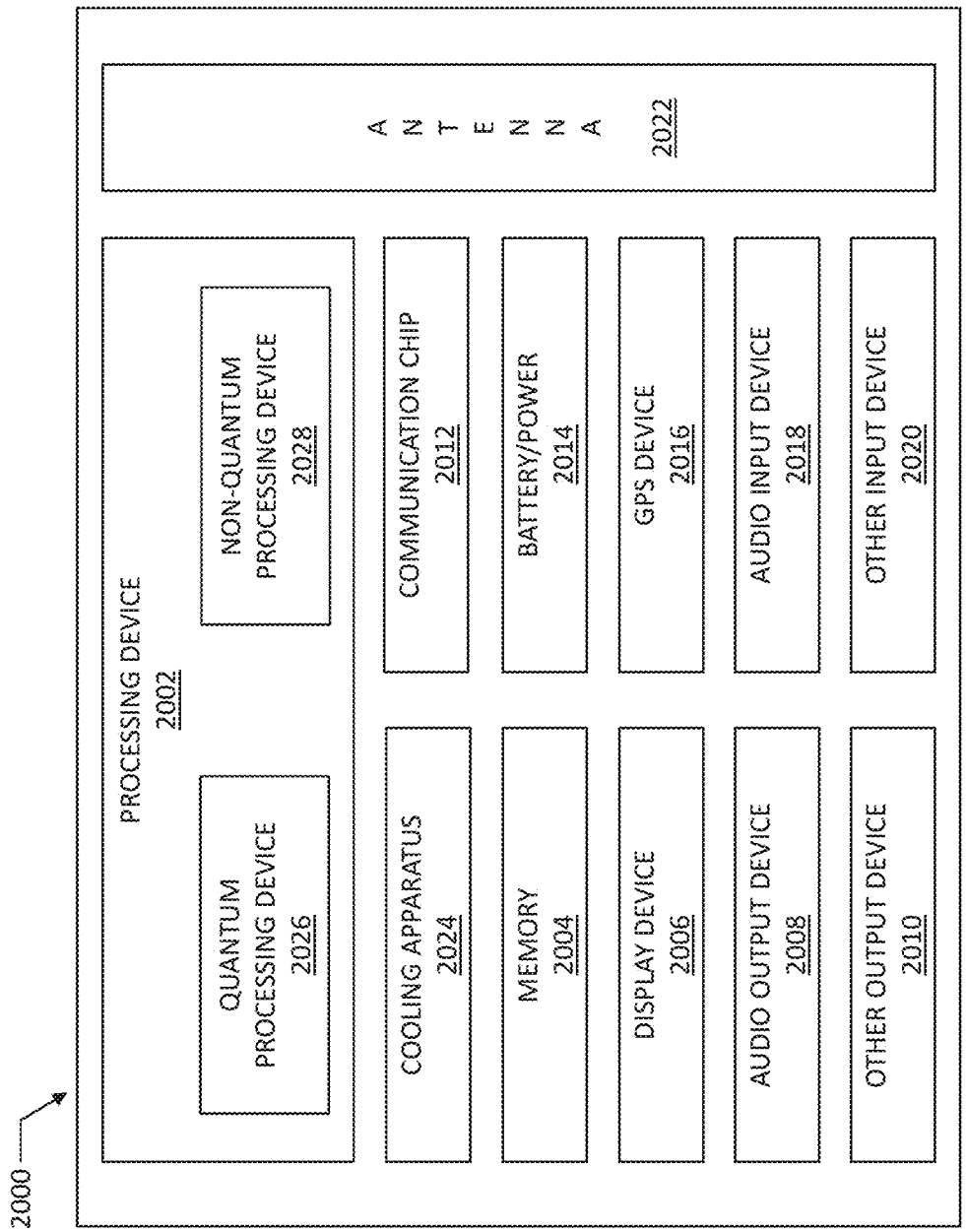
FIG. 7 is a block diagram of an example quantum computing device that may include any of the quantum dot devices disclosed herein, in accordance with various embodiments.

FIG. 7 is a block diagram of an exemplary quantum computing device 2000 that may include one or more of quantum circuit assemblies with any of the quantum dot devices 100 in accordance with any of the layout designs described herein, according to some embodiments of the present disclosure. A number of components are illustrated in FIG. 7 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 7, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled. In further examples, the quantum computing device 2000 may include a microwave input device or a microwave output device (not specifically shown in FIG. 7), or may include microwave input or output device interface circuitry (e.g., connectors and supporting circuitry) to which a microwave input device or microwave output device may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of any of the quantum dot devices 100 arranged in accordance with various layout designs described herein, and may perform data processing by performing operations on the quantum dots that may be generated in these quantum circuit assemblies, and monitoring the result of those operations. For example, different quantum dots may be allowed to interact, the quantum states of different quantum dots may be set or transformed, and the quantum states of different quantum dots may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of quantum dots in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2024. The cooling apparatus 2024 may maintain the quantum processing device 2026, in particular the quantum circuits 100 as described herein, at a predetermined low temperature during operation to avoid qubit decoherence and to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2024 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (CPRS), Universal Mobile Telecommunications System (UMTS), High Speed Packet Access (HSPA), Evolved HSPA (E-HSPA), or LIE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DC)), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet), As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014, The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (OR) code reader, any sensor, or a radio frequency identification (RFD) reader.

The quantum computing device 2000, or a subset of its components, may have any appropriate form factor, such as a hand-held or mobile computing device (e.g., a cell phone, a smart phone, a mobile Internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide examples of various ones of the embodiments disclosed herein.

Example 1 provides a quantum dot device that includes a quantum well stack, a plurality of first gates above the quantum well stack, and a plurality of second gates above the quantum well stack, where, for at least some of the plurality of second gates, each second gate is in between two first gates which form a second-nearest neighbor pair (e.g. an individual second gate is in between a respective second-nearest neighbor pair of first gates).

Example 2 provides the quantum dot device according to Example 1, where the each second gate is closer to a first one of the two first gates than to a second one of the two first gates.

Example 3 provides the quantum dot device according to Example 2, where a distance between the each second gate and the first one of the two first gates is between 10 and 100 nanometers.

Example 4 provides the quantum dot device according to Examples 2 or 3, where a distance between the each second gate and the second one of the two first gates is between 15 and 250 nanometers.

Example 5 provides the quantum dot device according to any one of the preceding Examples, where the plurality of first gates are arranged as points in a grid/array with the points arranged in a triangular lattice.

Example 6 provides the quantum dot device according to Example 5, where said triangular lattice is a first triangular lattice, and the plurality of second gates are arranged as points in a grid/array with the points arranged in a second triangular lattice offset with respect to the first triangular lattice.

Example 7 provides the quantum dot device according to any one of the preceding Examples, where the plurality of first gates and the plurality of the second gates are arranged as points in a hexagonal/honeycomb array.

Example 8 provides the quantum dot device according to any one of the preceding Examples, where an individual gate of the plurality of first gates and the plurality of the second gates has less than four nearest neighbors.

Example 9 provides the quantum dot device according to any one of the preceding Examples, where, in an array of the plurality of first gates and the plurality of the second gates, all nearest neighbors for an individual first gate are second gates.

Example 10 provides the quantum dot device according to any one of the preceding Examples, where, in an array of the plurality of first gates and the plurality of the second gates, all nearest neighbors for an individual second gate are first gates.

Example 11 provides the quantum dot device according to any one of the preceding Examples, where an individual gate of the plurality of first gates and the plurality of the second gates has six second-nearest neighbors.

Example 12 provides the quantum dot device according to any one of the preceding Examples, where the plurality of first gates are arranged in electrically continuous first rows and the plurality of second gates are arranged in electrically continuous second rows, the second rows being parallel to the first rows.

Example 13 provides the quantum dot device according to any one of the preceding Examples, where an individual first gate includes a first gate metal that extends to two and only two of nearest neighbor pairs (i.e. nearest neighbors to said individual first gate) of the plurality of first gates.

Example 14 provides the quantum dot device according to any one of the preceding Examples, where an individual second gate includes a second gate metal that extends to two and only two of nearest neighbor pairs (i.e. nearest neighbors to said individual second gate) of the plurality of second gates.

Example 15 provides the quantum dot device according to any one of the preceding Examples, further including a spacer material electrically isolating gate metals of different gates of the plurality of first gates and the plurality of second gates.

Example 16 provides the quantum dot device according to any one of the preceding Examples, further including one or more hardmasks above one or more of the plurality of first gates and the plurality of second gates.

Example 17 provides the quantum dot device according to any one of the preceding Examples, further including a plurality of magnets disposed above the plurality of first gates.

In various further Examples, the first gates of Example provides the quantum dot device according to any one of the preceding Examples may be the quantum dot gates as described herein, while the second gates may be the barrier gates as described herein.

Example 18 provides a quantum dot device that includes a quantum well stack, a plurality of quantum dot gates above the quantum well stack, and a plurality of barrier gates above the quantum well stack, where the plurality of barrier gates are arranged in electrically continuous first rows and the plurality of quantum dot gates are arranged in electrically continuous second rows parallel to the first rows.

Example 19 provides the quantum dot device according to Example 18, where the plurality of barrier gates are arranged as points in a grid/array with the points arranged in a triangular lattice.

Example 20 provides the quantum dot device according to Examples 18 or 19, where the plurality of quantum dot gates are arranged as points in a grid/array with the points arranged in a triangular lattice.

In various further Examples, the quantum dot gates of Example provides the quantum dot device according to any one of Examples 18-20 may be the first gates and the barrier gates of Example provides the quantum dot device according to any one of Examples 18-20 may be the second gates, and Example provides the quantum dot device according to any one of Examples 18-20 may further include features of, or be, Example provides the quantum dot device according to any one of the preceding Examples (e.g. Examples 1-17).

Example 21 provides a quantum dot device that includes a quantum well stack, and a plurality of gates arranged as points in an array above the quantum well stack, where the array is such that an individual gate of the plurality of gates has less than four nearest neighbors (i.e. each gate of the plurality of gates has less than four, e.g. three, nearest neighbors).

Example 22 provides the quantum dot device according to Example 21, where the plurality of gates includes a plurality of first gates and a plurality of second gates, the individual gate is an individual first gate, and the nearest neighbors for the individual gate are gates of the plurality of second gates.

Example 23 provides the quantum dot device according to Example 22, where the first gates are quantum dot gates and the second gates are barrier gates.

In various further Examples, Example provides the quantum dot device according to any one of Examples 21-23 may be Example provides the quantum dot device according to any one of the preceding Examples (e.g. any one of Examples 1-20).

Example 24 provides a quantum computing device that includes a quantum processing device, where the quantum processing device includes a quantum dot device, where the quantum dot device includes a quantum well stack, a plurality of first gates above the quantum well stack, and a plurality of second gates above the quantum well stack, and a non-quantum processing device which is coupled to the quantum processing device and configured to control electrical signals applied to the first and second gates. The quantum computing device further includes a memory device configured to store data generated during operation of the quantum processing device. In such a quantum computing device, an individual second gate may be in between a different second-nearest neighbor pair of first gates, or/and the plurality of first gates may be arranged in electrically continuous first rows and the plurality of second gates may be arranged in electrically continuous second rows parallel to the first rows.

Example 25 provides the quantum computing device according to Example 24, further including a cooling apparatus configured to maintain the temperature of the quantum processing device below 5 degrees Kelvin.

Example 26 provides the quantum computing device according to any of Examples 24-25, where the memory device is configured to store instructions for a quantum computing algorithm to be executed by the quantum processing device.

Example 27 provides the quantum computing device according to any of Examples 24-26, further including a non-quantum processing device coupled to the quantum processing device.

In various further Examples, the quantum dot device of the quantum processing device according to any one of Examples 24-27 may be Example provides the quantum dot device according to any one of the preceding Examples (e.g., Example provides the quantum dot device according to any one of Examples 1-23).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. A quantum dot device, comprising:
   a quantum well stack;
   a plurality of first gates above the quantum well stack; and
   a plurality of second gates above the quantum well stack;
   wherein, for one or more of the plurality of second gates,
      a second gate is in between two first gates of the plurality of first gates, and
   wherein:
      either the plurality of first gates are arranged in a triangular lattice,
      or the plurality of first gates and the plurality of the second gates are arranged in a hexagonal array.

2. The quantum dot device according to claim 1, wherein the second gate is closer to a first one of the two first gates than to a second one of the two first gates.

3. The quantum dot device according to claim 2, wherein a distance between the second gate and the first one of the two first gates is between 10 and 100 nanometers.

4. The quantum dot device according to claim 2, wherein a distance between the second gate and the second one of the two first gates is between 15 and 250 nanometers.

5. The quantum dot device according to claim 1, wherein said triangular lattice is a first triangular lattice, and the plurality of second gates are arranged in a second triangular lattice, where the second triangular lattice is offset with respect to the first triangular lattice.

6. The quantum dot device according to claim 1, wherein an individual gate of the plurality of first gates and the plurality of the second gates has less than four nearest neighbors.

7. The quantum dot device according to claim 1, wherein, in an array of the plurality of first gates and the plurality of the second gates, nearest neighbors for an individual first gate are second gates.

8. The quantum dot device according to claim 1, wherein, in an array of the plurality of first gates and the plurality of the second gates, nearest neighbors for an individual second gate are first gates.

9. The quantum dot device according to claim 1, wherein an individual gate of the plurality of first gates and the plurality of the second gates has six second-nearest neighbors.

10. The quantum dot device according to claim 1, wherein the plurality of first gates are arranged in electrically continuous first rows and the plurality of second gates are arranged in electrically continuous second rows parallel to the first rows.

11. The quantum dot device according to claim 1, wherein an individual first gate includes a first gate metal that extends to two of nearest neighbor pairs of the plurality of first gates.

12. The quantum dot device according to claim 1, wherein an individual second gate includes a second gate metal that extends to two of nearest neighbor pairs of the plurality of second gates.

13. The quantum dot device according to claim 1, further comprising:
   a plurality of magnets above at least some of the first gates.

14. The quantum dot device according to claim 1, wherein the quantum dot device is a quantum processing device.

15. A quantum computing device, comprising:
   a quantum processing device, wherein the quantum processing device includes a quantum dot device, wherein the quantum dot device includes a quantum well stack,
   a plurality of quantum dot gates above the quantum well stack, and
   a plurality of barrier gates above the quantum well stack,
   wherein the plurality of barrier gates are arranged in electrically continuous first rows and the plurality of quantum dot gates are arranged in electrically continuous second rows parallel to the first rows, and
   wherein either the plurality of barrier gates or the plurality of quantum dot gates are arranged in a triangular lattice;
   a non-quantum processing device, coupled to the quantum processing device, to control electrical signals applied to the plurality of quantum dot gates and the plurality of barrier gates; and
   a memory device, to store data generated during operation of the quantum processing device.

16. The quantum computing device according to claim 15, further comprising:
   a cooling apparatus to maintain a temperature of the quantum processing device below 5 degrees Kelvin.

17. The quantum computing device according to claim 15, wherein the memory device is to store instructions for a quantum computing algorithm to be executed by the quantum processing device.

18. A quantum dot device, comprising:
   a quantum well stack; and
   a plurality of first gates and a plurality of second gates in an array above the quantum well stack,
   wherein the array is such that, for at least one first gate:
      nearest neighbors for the at least one first gate are gates of the plurality of second gates, and
      second-nearest neighbors for the at least one first gate are other gates of the plurality of first gates, and
   wherein the array includes at least one hexagon of three of the plurality of first gates and three of the plurality of second gates as six vertices of the hexagon, where, in the hexagon, nearest neighbors of each of the three of the plurality of first gates are two gates of the three of the plurality of second gates, and second-nearest neighbors of each of the three of the plurality of first gates are other two gates of the three of the plurality of first gates.

19. The quantum dot device according to claim 18, wherein the first gates are quantum dot gates and the second gates are barrier gates.

* * * * *